United States Patent [19]
Liu et al.

[11] Patent Number: 6,027,974
[45] Date of Patent: Feb. 22, 2000

[54] NONVOLATILE MEMORY

[75] Inventors: David Kuan-Yu Liu, Fremont; Ting-wah Wong, Cupertino, both of Calif.

[73] Assignee: Programmable Silicon Solutions, Sunnyvale, Calif.

[21] Appl. No.: 09/200,111

[22] Filed: Nov. 25, 1998

Related U.S. Application Data

[63] Continuation-in-part of application No. 08/838,854, Apr. 11, 1997, Pat. No. 5,867,425.

[51] Int. Cl.$^7$ .................................................. H01L 21/336
[52] U.S. Cl. .......................... 438/258; 438/257; 438/266; 438/267; 365/185.08
[58] Field of Search ....................... 365/185.08; 438/258, 438/266, 257, 267

[56] References Cited

U.S. PATENT DOCUMENTS

| | | | |
|---|---|---|---|
| 5,449,634 | 9/1995 | Inoue | 437/52 |
| 5,472,891 | 12/1995 | Komori et al. | 437/43 |
| 5,712,178 | 1/1998 | Cho et al. | 437/43 |
| 5,880,499 | 3/1999 | Oyama | 257/316 |

*Primary Examiner*—David Nelms
*Assistant Examiner*—Hien Nguyen
*Attorney, Agent, or Firm*—Trop, Pruner, Hu & Miles, P.C.

[57] ABSTRACT

A nonvolatile memory cell which is highly scalable includes a cell formed in a triple well. A select transistor can have a source which also acts as the emitter of a lateral bipolar transistor. The lateral bipolar transistor operates as a charge injector. The charge injector provides electrons for substrate hot electron injection of electrons onto the floating gate for programming. The cell depletion/inversion region may be extended by forming a capacitor as an extension of the control gate over the substrate between the source and channel of said sense transistor.

15 Claims, 4 Drawing Sheets

NONVOLATILE MEMORY

This application is a continuation-in-part of U.S. patent application Ser. No. 08/838,854, filed Apr. 11, 1997, now a U.S. Pat. No. 5,867,425.

BACKGROUND

This invention relates generally to nonvolatile memories and particularly to electrically erasable nonvolatile memories.

Nonvolatile memory cells are advantageous since they retain recorded information even when the power to the memory is turned off. There are several different types of non-volatile memories including erasable programmable read only memories (EPROMs), electrically erasable and programmable read only memories (EEPROMs) and flash EEPROM memories. EPROMs are erasable through light exposure but are electrically programmable by channel hot electron injection onto a floating gate. Conventional EEPROMs have the same programming functionality, but instead of being light erasable they can be erased and programmed by electron tunneling. Thus, information may be stored in these memories, retained when the power is off, and the memories may be erased for reprogramming, as necessary, using appropriate techniques. Flash EEPROMs may be block erased, typically giving them better read access times than regular EEPROMs.

Currently, flash memories have gained considerable popularity. For example, flash memories are often utilized to provide on-chip memory for microcontrollers, modems and SMART cards and the like where it is desirable to store codes that may need fast updating.

While flash memories and EEPROMs are closely related, in many instances flash memories are preferred because their smaller cell size means that they can be made more economically. However, flash memories and EEPROMs often have very similar cell attributes.

Nonvolatile memory cells differ in certain respects from the transistors that are generally utilized in electronic components called logic devices, such as microcontrollers, that work with the memory cells. Logic devices are formed of transistors that use a single gate electrode. Nonvolatile memories usually include two gate electrodes, known as the control and floating gate electrodes, situated one over the other. Because of this structural difference, nonvolatile memories and logic devices may be made by different processes. This may contribute to a substantial increase in process complexity and manufacturing cost.

Particularly with an EEPROM, the electrical programming of the cells normally requires substantial potentials to be applied to the cells. These potentials induce electron tunneling from an N+ region onto the floating gate. Additional complexity may arise from the need to provide substantially larger voltages to memory cells than are needed for normal transistor operation.

While the industry has come to accept the need for separate process technologies for logic and nonvolatile memories and while those in the industry have also come to appreciate that significant currents to program flash EEPROMs, there would be a substantial demand for a nonvolatile memory which was both electrically erasable and programmable without the need for special process technologies or for relatively higher programming voltages and higher currents.

Furthermore, with the conventional FLASH EEPROMs, the electrical programming of the cells normally requires high current to be applied to the cells. A very minute amount of this electron current becomes injected from the drain depletion region onto the floating gate. This means that the injection efficiency of such devices is low (e.g., $1\times10^{-9}$). The requirement of high current adds additional complexity because of the design of the high current pump operated at low voltage.

SUMMARY

In accordance with one embodiment, a method of forming a memory cell includes forming a first gate and a second gate spaced from one another. The first and second gates are used as an implant mask to form an implanted region between the gates.

DESCRIPTION OF THE PREFERRED EMBODIMENT

Figure 1:
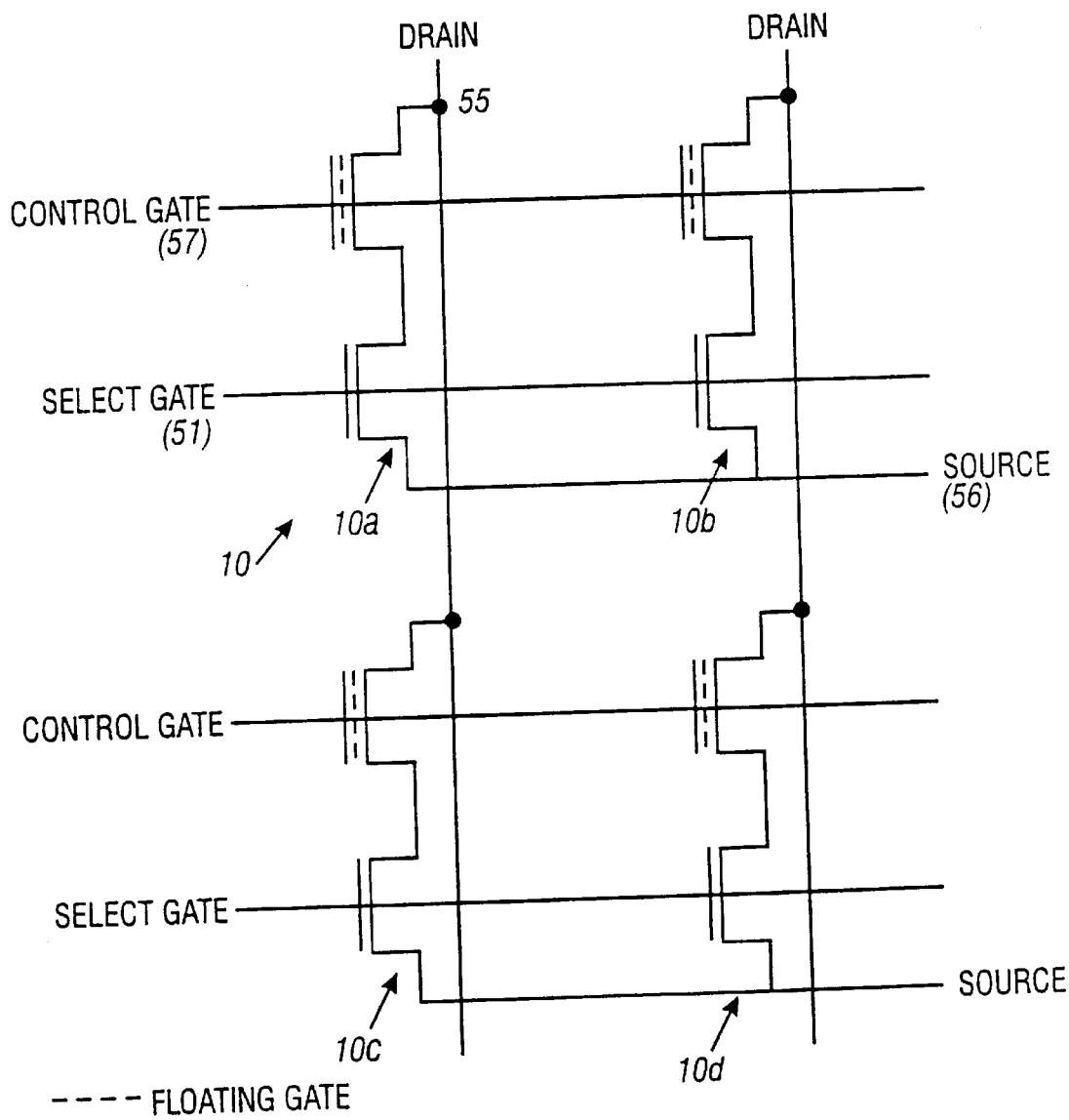
FIG. 1 is a schematic depiction of an array configuration for one embodiment.

Referring to the drawing wherein like reference characters are used for like parts throughout the several views, a memory cell 10, shown in FIG. 1, includes a sense transistor 12 and a select transistor 14. This structure is advantageously implemented on a semiconductor layer having situated thereon an electrically isolated floating gate 22.

For each cell 10a–10d, the source 13 of the select transistor 14 is controlled by the source node 56. The gate of the select transistor 11 is controlled by the node 51. The control gate 27 of the sense transistor 12 is controlled by the control node 57. The drain 16 of the sense transistor 12 is connected to the drain node 55.

Figure 2:
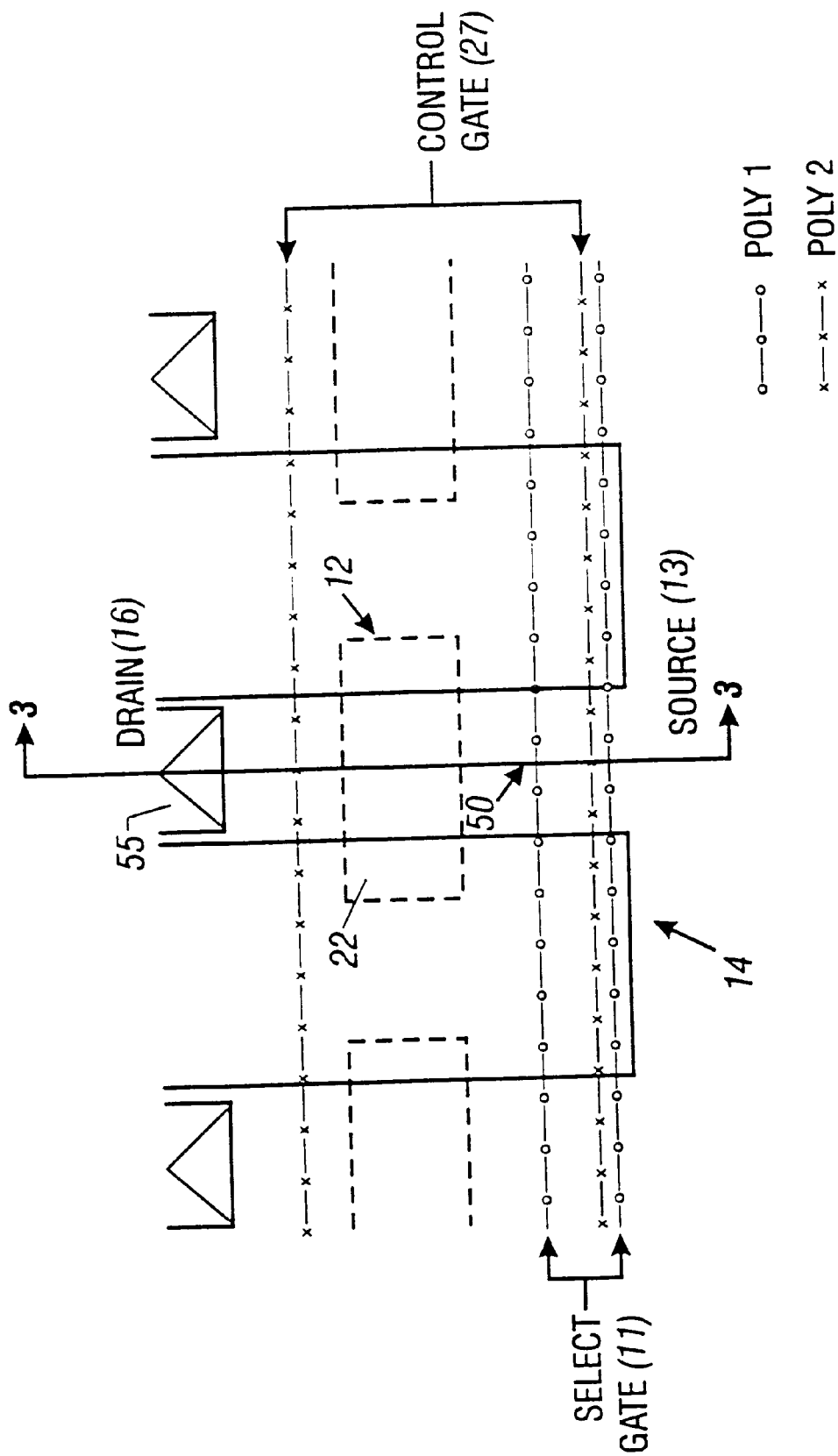
FIG. 2 is a greatly enlarged top plan view showing the layout of a semiconductor implementation of one cell of the embodiment shown in FIG. 1.

One layout for implementing a cell 10, shown in FIG. 2, includes the control gate 27. The control gate 27 extends across the active region 18 which is bordered by the drain 16 of the sense transistor 12 and the source 13 of the select transistor 14. The select gate 11 also extends parallel to and underneath the control gate 27, bordering the edge of the control gate 27 and the region 15a. The control gate 27 may be non-self-aligned to the select gate 11 and the sense gate 12. The floating gate 22 is also situated in isolation under the control gate 27, over the active region 18.

The drain 16 may include a contact 55 is illustrated in FIG. 2 which connects to the drain diffusion 16. The source node 56 may also be implemented by a contact.

Figure 3:
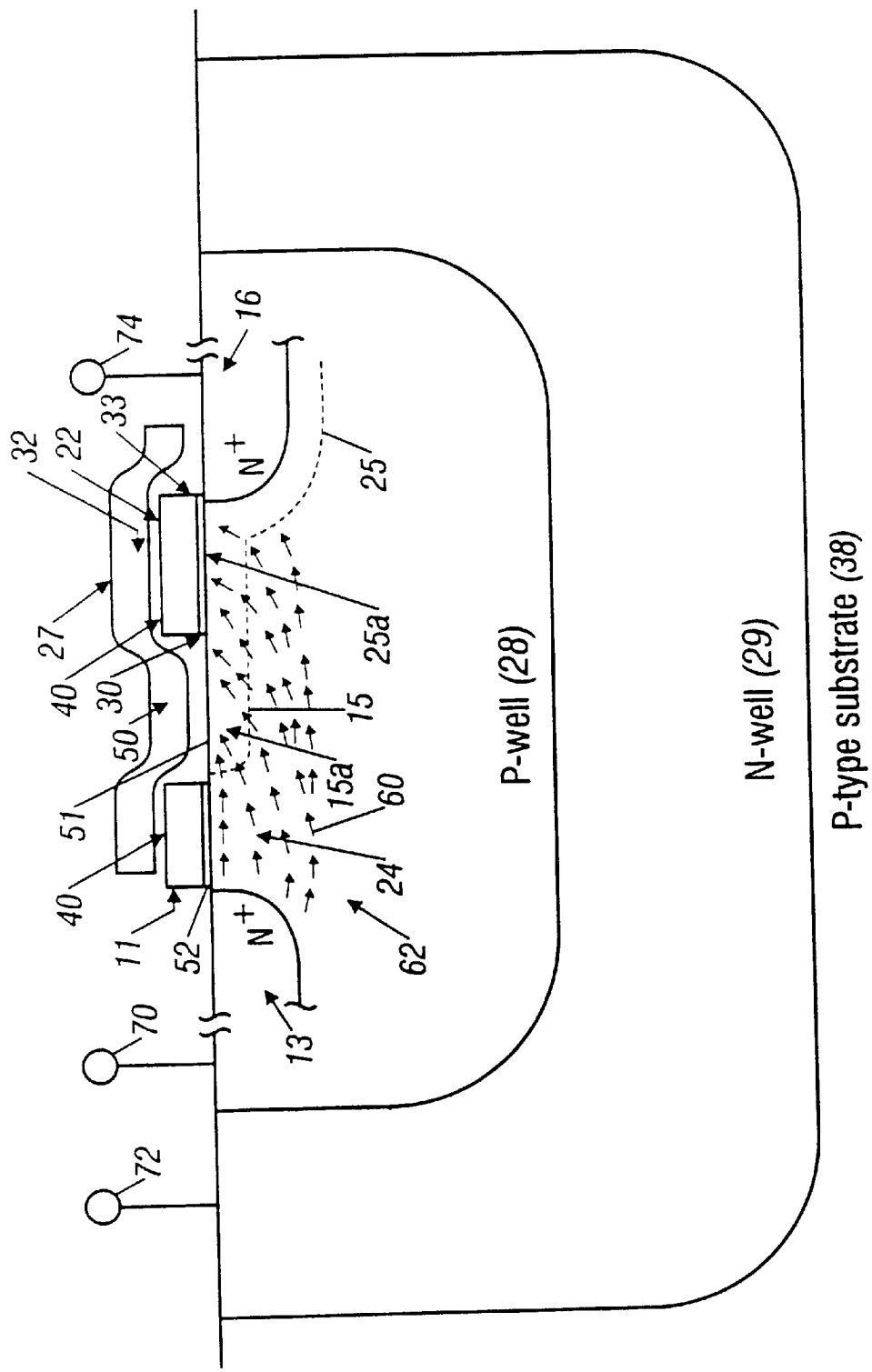
FIG. 3 is a cross-sectional view taken generally along the line 3—3 in FIG. 2.

The relationship of the sense transistor 12 and select transistor 14 is illustrated in FIG. 3. The floating gate 22 forms portions of the transistor which has a drain 16 and a source 13. Similarly, the select gate 11 forms the other portion of the transistor between the source 13 and the drain 16. The sense transistor 12 includes a channel 25a while the select transistor 14 includes a channel 24. The control gate forms the plate of the capacitor whose channel is 15a. The select gate 14, the floating gate 22 and the control gate 27 form the gates of a transistor with a source 13 and drain 16.

In the illustrated embodiment, the channels 25a and 24 are P-type semiconductor material and are part of a P-well 28. The P-well 28 in turn is formed in an N-well 29. Finally, the N-well 29 is formed in a P-type substrate 38. The P-well 28 may be biased, as indicated at 70, and the N-well 29 may be biased, as indicated at 72.

A capacitor 50 is formed where the control gate 27 overlays the substrate region 15a between the select gate 11 and the floating gate 22. It controls the depletion/inversion of the region 15a to create an extension of the depletion/inversion region 25 formed by the sense transistor 12. It is operated during programming and read operations. In read operation, the capacitor 50 bridges the sense and select transistor channels by forming an inverted region. When the inverted region, under region 15a is formed, the sense and select transistors 12 and 14 are connected.

The floating gate 22 forms the tunneling capacitor 33 by its interaction with the channel 25a. A tunnel oxide 30 separates the floating gate 22 from the channel 25a. Similarly the interpoly dielectric oxide 40, which is part of a coupling capacitor 32, separates the floating gate 22 from the control gate 27. Finally, the control gate 27 is separated by the oxide 51 from the region 15a. Likewise the select transistor 14 includes a gate oxide 52, which may be of the same thickness as the tunnel oxide 30.

The overlaying of the control gate 27 over the select gate 11 is for processing convenience. Similarly, the control gate 27 is shown as overlaying the drain 16, but this too is merely for processing convenience. The control gate 27 need not be self-aligned to the sense or select transistors.

The cell 10 may be described as a flash EEPROM utilizing high efficiency substrate hot electron injection for programming and Fowler-Nordheim tunneling for erasure. The process of substrate hot electron injection is well described in T. H. Ning, C. M. Osburn, and H. W. Yu "Emission Probability of Hot Electrons from Silicon into Silicon Dioxide,"J. Appl. Phus., vol. 48, p. 286, (1977); Boaz Eitan, James L. McCreary, Daniel Amrany, Joseph Shappir, "Substrate Hot-electron Injection EPROM," IEEE Transactions on Electron Devices, Vol. ED-31, No. 1, p. 934, (July 1984); I. C. Chen, C. Kaya, and J. Paterson, "Band-to-Band Tunneling Induced Substrate Hot-electron (BBISHE) Injection: A New Programming Mechanism for Nonvolatile Memory Devices," IEDM (1989) p. 263; and C. Y. Hu, D. L. Kencke, S. K. Benerjee, "Substrate-current-induced Hot Electron (SCIHE) Injection: A New Convergence Scheme for FLASH Memory," IEDM (1995), p. 283. Each of these articles is hereby expressly incorporated by reference herein.

Programming is achieved by high efficiency substrate hot electron injection. As indicated in FIG. 3, substrate electrons, indicated by the arrows at 60, are generated by forward biasing the source 13 which is separated from the sense transistor 12 channel 25a by the select transistor channel 24 and the region 15a under the capacitor 50. Some of the substrate electrons 60 diffuse through the region underneath the channel 24 to the channel region 25a underneath the sense transistor 12.

For cells that need to be programmed, the channel region 25a is biased such that a depletion region 25 is formed. The depletion region 25 is extended, as indicated at 15, by the operation of the capacitor 50, under the capacitor 50 as well. When an electron gets to the depletion region 25, it is accelerated by an electric field, Vcs. The electric field Vcs is the difference between the channel 25a potential (potential of the surface inversion region) and the P-well 28 potential. Some of these electrons gain sufficient energy, in excess of the effective oxide barrier height potential, to be injected onto the floating gate 22.

For cells that are not to be programmed, the channel-to-P-well potential is less than the effective oxide barrier height. In such a case, the electrons would not gain sufficient energy to overcome the barrier height and are not injected onto the floating gate 22.

The N+ doped region 13, the P-region 24 under the select transistor 14 and the sense transistor channel 25a, and the depletion region 15 under the capacitor 50 form a lateral bipolar transistor 62. The emitter (source 13) of the bipolar transistor 62 acts as a charge injector, injecting substrate electrons from the source diffusion to the biased depletion region under the floating gate 22. With the diffusion 13 as the emitter and the channel 24 as the base, the collector is the biased depletion region 25 (including the region 15). Since the channel region 25a acts as the channel for the sense transistor during read, and the biased depletion region 25 under the sense transistor 12 acts as the collector of the bipolar transistor 62 during programming, a compact cell layout is achieved.

The efficiency of substrate hot electron injection is a function of a number of characteristics. Considering the depletion region 25, electrons scatter with lattice phonon scattering across the depletion region 25 with a certain electron mean free path. Some of these electrons, without much scattering, gain sufficient energy to overcome the effective barrier height and are injected onto the floating gate 22. Some electrons gain less energy than the effective barrier height and are not injected onto the floating gate 22. The injection efficiency is a strong function of the doping concentrations and the channel-to-P-well potential, Vcs.

Since the cell 10 is situated in a P-well 28 embedded in an N-well 29, during programming the floating gate 22 is capacitively coupled to a higher voltage through the coupling capacitor 32 by raising the control gate 27 to Vpp, which may be from 7 to 14 volts. The voltage that the floating gate 22 attains at low drain bias is approximately a function of the voltage on the floating gate when the control gate 27 and the P-well 28 and drain 16 are at ground, plus the coupling ratio times the voltage on the control gate 27. The coupling ratio, to a first order, is approximately equal to the capacitance of the capacitor 32 divided by the sum of the capacitances of the coupling capacitor 32 and the tunneling capacitor 33.

When the select transistor 14 is off, the sense transistor drain 16 potential can be forced close to the supply potential Vcc or higher. Since the select transistor 14 is off, the potential of node 51 follows the channel 25a potential. The channel 25a potential, which is the potential of the surface inversion region of the channel region 25a, is set as follows. When the potential of the floating gate 22 (Vfg) is one sense transistor 12 threshold voltage higher than the drain 16 potential, the channel potential is the same as the drain potential. On the other hand, when the floating gate 22 potential is less than the drain 16 potential plus the sense transistor 12 threshold voltage, the channel potential is the difference between the floating gate 22 voltage and the sense transistor 12 threshold voltage.

The P-well potential is the voltage 70 applied to the P-well 28. Since the P-well 28 is embedded in an N-well 29, and the N-well is set at a voltage 72 approximately Vss or higher, the P-well potential Vp can be negative, typically negative one to negative two volts. Moreover, it is usually less than the effective oxide barrier height to avoid any potential disturb problem.

The potential difference between the channel 25a region and the P-well 28 potential (Vp) 70 is the voltage across the depletion region 25. For cells to be programmed, the drain 16 voltage is raised high, typically close to Vcc or higher. A depletion region 25 in the channels 25a and 24 underneath the sense transistor 12 and the capacitor 50 is formed with a voltage drop equal to the channel potential minus the P-well potential 70.

For those cells that are not to be programmed, the drain 16 voltage 74 is set to zero volts (Vss). The voltage drop across the depletion region 25 then is equal to the absolute value of Vp, which is typically less than the effective oxide barrier height.

Cell 10 erasure is achieved by Fowler-Nordheim tunneling of electrons from the floating gate 22 to the channel region 25a and the drain diffusion 16. During erasure, the control gate 27 is forced to a negative voltage from −7 to −14 volts, for example, As for the drain diffusion 16, the P-well 28, and the N-well 29, they are biased to a positive potential close to Vcc or higher. Vcc is determined by the particular technology utilized. For example, it could be 5.0 to 2.5 volts with present technologies. This reduces the electric field across the junction between the N+ diffusion 16 and the P-well 28. The reduced field prevents acceleration of hot hole trapping in the gate oxide under the floating gate 22.

The drain 16 is preferably not biased to a voltage higher than the P-well 28 to such an extent that gate induced drain leakage (GIDL) becomes a problem. With current technologies, this means that the drain 16 bias cannot be higher than the P-well 28 bias by about one volt. In addition, if the drain 16 bias significantly exceeds the P-well 28 bias, hot hole trapping may occur in the select gate oxide 52 due to the lateral junction field acceleration.

The ability to apply a positive voltage to the P-well arises because the P-well 28 is embedded in an N-well 29. The P-well voltage is preferably equal to or less than N-well potential to avoid P-well/N-well forward biasing. Thus, applying a positive voltage of Vcc or higher to the P-well, N-well and the drain 16 can eliminate hot hole trapping induced by GIDL while allowing the drain 16 voltage to be raised to Vcc or higher.

The voltage across the capacitor 33 is the difference between the floating gate 22 potential on the one hand and the diffusion 16 and P-well 28 potentials. When the difference exceeds 8 to 10 volts, sufficient tunneling current is generated and the floating gate 22 can be erased to a negative potential in the time frame of a few milliseconds to a few seconds, depending on the tunneling oxide 30 thickness.

Electrons tunnel to the drain region 16 (drain erase). The tunneling current depends on the voltage from the floating gate 22 to the drain 16.

Reading the programming state of the cell 10 may be accomplished as follows. The floating gate 22 is capacitively coupled to a higher potential by forcing the control gate 27 to a positive potential, for example, of 2.5 to 5 volts. The floating gate 22 is coupled to a potential Vfg which can be calculated as being equal to the sum of the floating gate potential when the control gate 27 is held at ground, plus the potential on the control gate 27 times the coupling ratio.

The drain 16 potential during reading is limited to a voltage of less than 2 volts. This is to avoid any read disturb.

For the selected cell to be read, the select gate 11 is forced to Vcc, and the source 13 is forced to ground. The unselected select gate 11 is also forced to ground.

When these potentials are applied to the selected cell 10, a current flows through the sense transistor 12. This current is then fed to a current sense amplifier (not shown). If the voltage on the floating gate 22 is greater than the threshold voltage on the sense transistor 12, a higher current, perhaps greater than 20 microamps, is detected as the conducting state. When the potential of the floating gate is less than the threshold voltage, a lower current, for example of less than one microamp flows, and a nonconducting state is detected.

A detected conducting state can be called a one state. A nonconducting state can be called the zero state.

An example of the operation of the cell in programming, reading and erasing is summarized in the following chart:

| | Cell Operation | | | | | |
|---|---|---|---|---|---|---|
| | Erase | | Program | | Read | |
| | (Selected) | (Unselected) | (Selected) | (Unselected) | (Selected) | (Unselected) |
| Drain (55) | ≧Vcc | *0 or ≧Vcc | ≧Vcc | *0 or ≧Vcc | ~1.5 v | *0 or ~ 1.5 V |
| Source (56) | Float | Float | Vs | Float | Vss | Vss |
| Select (51) | Vss | Vss | Vss to Vs | Vss to Vs | Vcc | Vss |
| Control (57) | −7 to −14 V | Vss | Vpp | Vss | 2 to 5 V | Vss |
| N-well (29) | ≧Vcc | ≧Vcc | Vcc to Vss | Vcc to Vss | Vcc | Vcc |
| P-well (28) | ≧Vcc | ≧Vcc | Vbias | Vbias | Vss | Vss |

*0 is for unselected column.
Vpp ≈ 7 to 14 volts.

Vs is the node voltage set by the injection current level, ranging from a few tens of nanoamps to a few tens of microamps depending on the programming speed requirement. Typically it would be from tens of milliseconds to tens of microseconds. Vbias is the bias on the P-well 28 which can be Vss or it can be forced to −1 to −2 volts to enhance injection efficiency.

A suitable on-chip circuit for generating two negative bias potentials, one to bias the control gate 57 and the other to negatively bias the P-well 28, can be found in L. A. Glasser and D. W. Dobberpuhl, :The Design and Analysis of VLSI Circuits," (December 1985), published by Addison-Wesley, at pages 301–329, hereby expressly incorporated by reference herein. Vss is the external ground potential.

While the cell 10 may be utilized as a single element, it can also be connected as an array as shown in FIG. 1. In the array, a plurality of cells 10, 10a, 10b, 10c, 10d are depicted. The source node 13 is formed by connecting all of the source nodes of cells in the same row as one single node 56. The control node 17 is formed by connecting all the control nodes of the individual cells in the same row together as a single node 57. The select gate node 11 is formed by connecting the select gate nodes for all the cells on the same row together as one node 51. Similarly, the drain node 16 is formed by connecting all the drain nodes for cells in the same column together as a single node 55. This node leads to the sense amplifier (not shown).

The cells in the array may be formed using conventional process technologies such as a double poly, single metal CMOS process. The illustrative parameters set forth herein contemplate a 0.25 μm or lower feature size with Vcc potentials of 1.8 volts. As the technology permits lowering voltages and smaller feature sizes, the parameters herein would scale accordingly.

The starting substrate material is typically P-type (100) silicon, for example having a resistivity in the range of 10–20 ohm-cm. The P-well 28 is embedded in an N-well 29 in the so-called triple well process. The P-well 28 has a typical well depth of, for example, 4–8 μm. The doping concentration may be from $4 \times 10^{15}$ to $1 \times 10^{16}$ atoms per cubic centimeter. The triple well is formed by the P-well 28 counterdoping the N-well 29.

The formation of the elements in the triple well is as follows. An N-well implant is done, for example, with phosphorus 31 with a typical dose of 1 to $1.5 \times 10^{13}$ atoms per square centimeter and an energy of 160 to 100 Kev. The N-well implant is driven using a high temperature step which may typically be 6 to 12 hours at 1125 to 1150° C. The N-well 29 is then counterdoped with a P-well implant. Typical dosages for the P-well implant could be 1.5 to $2.5 \times 10^{13}$ atoms per square centimeter with an energy of 30 Kev to 180 Kev using a species such as boron 11. The N-well 29 and P-well 28 are then driven, typically 6 to 10 hours at 1125 to 1150° C. This sets the wells to the desired doping concentrations and depths.

After the well formation, standard logic field oxide formation and channel stop formation steps are applied. The field oxide thickness and implant doses are adjusted to achieve a field threshold of 7 to 14 volts, which is determined by the Vpp level for programming and erasing and by logic process capability. After this formation, a memory cell implant may be performed. For example, a B11 implant at 30 to 50 Kev with a dose of 1.5 to $3 \times 10^{13}$ atoms per square centimeter may be done through sacrificial oxide. The gate oxide 52 and the tunnel oxide 30 are then formed. For example, an 85 to 100 Angstrom dry oxide may be grown across the wafer. A dry oxide is grown, for example, at 900° C. in partial oxygen followed by a 975 to 1050° C. anneal.

The floating gate 22 may then be formed of polysilicon, silicide or metals. If polysilicon is used, it can be 1600 Angstroms thick, and POCL3 doped at 870 to 1000° C. The interpoly dielectric is formed of an oxide-nitride-oxide sandwich (ONO) with the lower oxide being from 60 to 80 Angstroms, the nitride layer having a thickness of from 90 to 180 Angstroms and the upper oxide being from 30 to 40 Angstroms. A 125 to 200 Angstrom gate oxide may be grown for the oxide under the capacitor 50.

After floating gate and select gate definition, a N+ implant is implanted into the source of the select transistor 14 and the drain of the sense transistor 12. It is blocked between the two gates so that it does not enter the region under the plate of the capacitor 50, the N+ implant can be, for example, a phosphorus implant at 60 Kev, at a dose of 1 to $3 \times 10^{14}$ atoms per square centimeter may be followed by arsenic at 60 Kev, 2.5 to $4.5 \times 10^{15}$ atoms per square centimeter. It is also possible to form the source and drain using lightly doped drain (LDD) technology.

The polysilicon (poly 2) for the control gate may then be deposited and silicided if desired. The gates are patterned and defined using standard techniques. The control gate is not self-aligned to the sense and select gates.

With the completion of these capacitor and transistor structures, all subsequent processing for contacts and interconnect layers follows standard logic rear end processing.

Figure 4:
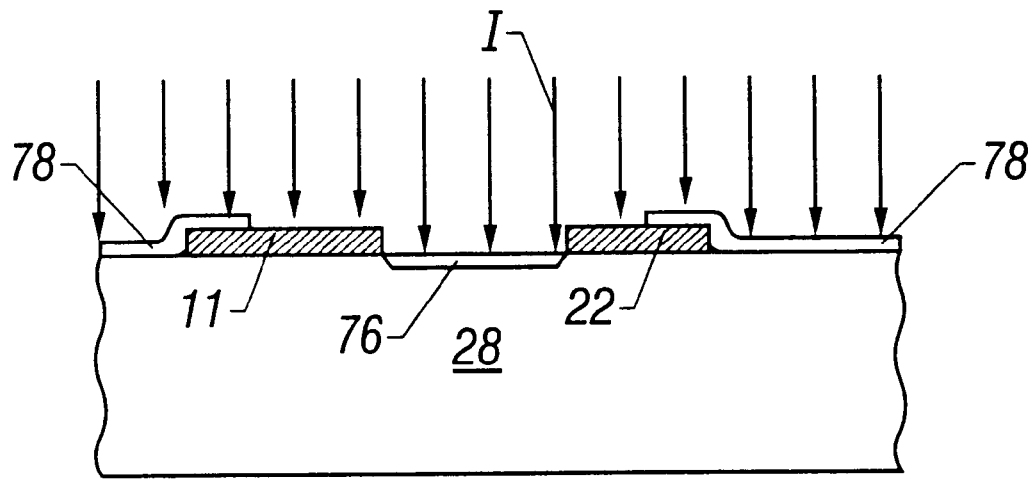
FIG. 4 is a cross-sectional view taken generally along the line 3—3 in FIG. 2 during the fabrication of the device.

Referring now to FIG. 4, an implanted region 76 may be formed prior to the deposition of the material that will form the control gate 27. The implant, indicated as "I" in FIG. 4, uses the select gate 11 and the floating gate 22 as implantation masks, supplemented by the mask 78 which may, for example, be formed of photoresist. In this way, an implant forms the implanted region 76 whose concentration may be tailored. The implant may, for example, use antimony as a species, since antimony does not move significantly in response to subsequent high temperature treatments.

Figure 5:
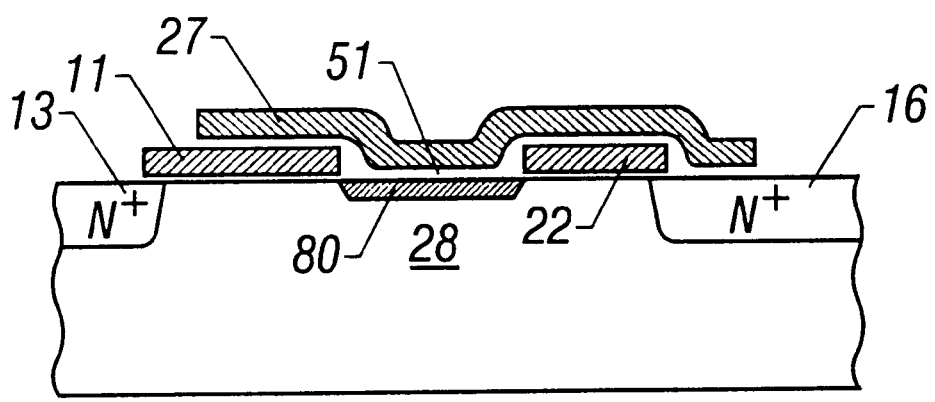
FIG. 5 is a cross-sectional view taken generally along the line 3—3 in FIG. 2 in another embodiment of the invention.

Referring to FIG. 5, after the control gate 27 has been formed together with the source and drains 13 and 16, the implant 76 is activated to become the region 80. The region 80 changes the threshold voltage of the control gate 27. Thus, the threshold voltage may be tuned as desired by varying, for example, the implant dosage and energy to thereby vary the concentration of the region 80. This allows the threshold voltage to be varied.

Without the region 80 it was difficult to tailor the threshold voltage since the threshold voltage is a function of the oxide thicknesses of the select gate 11 and the floating gate 22. Because of the thickness of the oxide 51 between the control gate and the substrate, the threshold voltage of the control gate may be relatively high absent the implant 76. A low current drive and high threshold voltage may result from the relatively thick oxide between the control gate and the substrate. The low current drive makes the device less desirable in some applications where a low supply voltage and/or high cell current are desirable. Moreover, in some cases it may be desirable to vary the cell current to meet different speed requirements.

The resistivity of the region 80 may be varied, for example, from approximately 100,000 ohms to 100 ohms. By taking into account the channel resistance of the select gate and the floating gate transistors, this resistivity range can easily translate into at least one order of magnitude of range for the cell current in the erased state. Thus, the cell can be tuned to any current within that current range. The high end side of the current may be targeted, for example in accordance with one embodiment of the invention, for high speed applications while the low end side of the cell current may be suitable for lower speed applications.

While a number of parameters and levels were provided in the foregoing description, those skilled in the art will appreciate that these parameters and levels are merely for illustration purposes. For example, by reversing the conductivity types of the doped junctions and the bias polarities, a cell structure using substrate hot hole injection may be implemented. It is intended that the appended claims cover all modifications and variations as fall within the true spirit and scope of the present invention.

What is claimed is:

1. A method of forming a memory cell comprising:
    forming a first gate and a second gate spaced from one another;
    using said first and second gates as an implant mask to form an implanted region between said gates; and
    using said first and second gates to form a select transistor and a sense transistor.

2. The method of claim 1 further including forming a third gate over said second gate.

3. The method of claim 2 including causing said third gate to overlap both said first gate and said second gate.

4. The method of claim 1 including tailoring said implant to achieve a desired threshold voltage between said third gate and said substrate.

5. The method of claim 1 including supplying substrate hot electrons to said sense transistor for programming said cell.

6. The method of claim 5 including causing said substrate electrons to be injected onto said second gate.

7. The method of claim 6 including causing said substrate electrons to move from a first region underneath said first gate to be injected onto said second gate.

8. The method of claim 7 including creating a depletion region under said second gate.

9. A method of forming a memory cell comprising:

forming a first gate and a second gate spaced from one another;

using said first and second gates as an implant mask to form an implanted region between said gates; and forming a third gate overlapping both said first gate and said second gate as well as the implanted region between said gates.

10. The method of claim 9 including using said first and second gates to form a select transistor and a sense transistor.

11. The method of claim 9 including using said third gate as a control gate.

12. The method of claim 11 including supplying substrate hot electrons to said sense transistor for programming said cell.

13. The method of claim 12 including causing said substrate hot electrons to be injected onto said second gate.

14. The method of claim 13 including causing said substrate hot electrons to move from a first region underneath said first gate to be injected onto said second gate.

15. The method of claim 14 including creating a depletion region under said second gate.

* * * * *